US 12,043,325 B2

(12) United States Patent
Federer et al.

(10) Patent No.: US 12,043,325 B2
(45) Date of Patent: Jul. 23, 2024

(54) REDUNDANT CONTROL UNIT FOR A MOTOR VEHICLE STEERING SYSTEM

(71) Applicants: thyssenkrupp Presta AG, Eschen (LI); thyssenkrupp AG, Essen (DE)

(72) Inventors: Tamas Federer, Budapest (HU); Attila Nagy, Dunaharaszti (HU); Peter Szalai, Budapest (HU)

(73) Assignees: thyssenkrupp Presta AG, Eschen (LI); thyssenkrupp AG, Essen (DE)

( * ) Notice: Subject to any disclaimer, the term of this patent is extended or adjusted under 35 U.S.C. 154(b) by 650 days.

(21) Appl. No.: 17/282,031

(22) PCT Filed: Oct. 4, 2019

(86) PCT No.: PCT/EP2019/076906
§ 371 (c)(1),
(2) Date: Apr. 1, 2021

(87) PCT Pub. No.: WO2020/074386
PCT Pub. Date: Apr. 16, 2020

(65) Prior Publication Data
US 2021/0339796 A1    Nov. 4, 2021

(30) Foreign Application Priority Data

Oct. 9, 2018  (DE) .................... 10 2018 124 906.3

(51) Int. Cl.
*B62D 5/04* (2006.01)
*B62D 5/00* (2006.01)
*G01R 19/00* (2006.01)

(52) U.S. Cl.
CPC ........... *B62D 5/0484* (2013.01); *B62D 5/001* (2013.01); *B62D 5/0493* (2013.01); *G01R 19/0046* (2013.01)

(58) Field of Classification Search
CPC .............. G01R 19/0046; B62D 5/0484; B62D 5/0493; B62D 5/001
See application file for complete search history.

(56) References Cited

U.S. PATENT DOCUMENTS 6,208,923 B1 * 3/2001 Hommel ................ B62D 5/003
 701/41
9,344,019 B2 * 5/2016 Furukawa ................. B60L 3/04
(Continued)

FOREIGN PATENT DOCUMENTS

| CN | 107010099 A | 8/2017 |
| DE | 100 53 335 A | 5/2002 |

(Continued)

OTHER PUBLICATIONS

English Translation of International Search Report issued in PCT/EP2019/076906, dated Jan. 29, 2020.

*Primary Examiner* — Tony H Winner
*Assistant Examiner* — Hosam Shabara
(74) *Attorney, Agent, or Firm* — thyssenkrupp North America, LLC

(57) ABSTRACT

A motor vehicle steering system may include an electric motor and a control unit that controls the electric motor. The control unit may have at least two redundant control paths for controlling the electric motor and an asymmetry detection device. The asymmetry detection device may be configured to compare electric current intensities of the at least two redundant control paths and to cause a faulty control path to be interrupted when there is asymmetry. Each of the at least two redundant control paths may include a switching element that is connected to the asymmetry detection device for interrupting the respective redundant control path.

16 Claims, 1 Drawing Sheet

(56) References Cited

U.S. PATENT DOCUMENTS

| | | | |
|---|---|---|---|
| 10,336,365 B2* | 7/2019 | Füzes | B62D 5/0484 |
| 11,554,805 B2* | 1/2023 | Niwa | B62D 5/046 |
| 2002/0057070 A1 | 5/2002 | Thomsen | |
| 2002/0177932 A1* | 11/2002 | Kifuku | B62D 5/0481 |
| | | | 180/443 |
| 2005/0156548 A1* | 7/2005 | Kawada | H02P 29/02 |
| | | | 318/432 |
| 2017/0080971 A1 | 3/2017 | Sóti et al. | |
| 2017/0272009 A1* | 9/2017 | Kawamura | B60L 3/0046 |
| 2021/0206427 A1* | 7/2021 | Balogh | B62D 5/0463 |

FOREIGN PATENT DOCUMENTS

| | | | |
|---|---|---|---|
| DE | 100 53 818 A | 5/2002 | |
| DE | 101 57 666 A | 6/2003 | |
| DE | 102015213304 A1 * | 11/2016 | B62D 5/0403 |
| EP | 3 219 579 A | 9/2017 | |
| EP | 3 242 393 A | 11/2017 | |
| JP | H05-20976 U | 3/1993 | |
| JP | 2007069848 A | 3/2007 | |
| WO | WO-2019174954 A1 * | 9/2019 | B62D 5/003 |

* cited by examiner

REDUNDANT CONTROL UNIT FOR A MOTOR VEHICLE STEERING SYSTEM

CROSS REFERENCE TO RELATED APPLICATIONS

This application is a U.S. National Stage Entry of International Patent Application Serial Number PCT/EP2019/076906, filed Oct. 4, 2019, which claims priority to German Patent Application No. DE 10 2018 124 906.3, filed Oct. 9, 2018, the entire contents of both of which are incorporated herein by reference.

FIELD

The present disclosure generally relates to motor vehicle steering systems and methods for controlling electric motors of motor vehicle steering systems.

BACKGROUND

Electromechanical steering systems have servomotors for providing steering assistance. When there is a short circuit in the motor controller, a fault is conventionally detected, but said fault can propagate unimpeded owing to the sudden failure of the voltage. This is undesired.

Thus, a need exists for a motor vehicle steering system, which has a protective device, which prevents propagation of a voltage failure in the motor controller.

DETAILED DESCRIPTION

Figure 1:
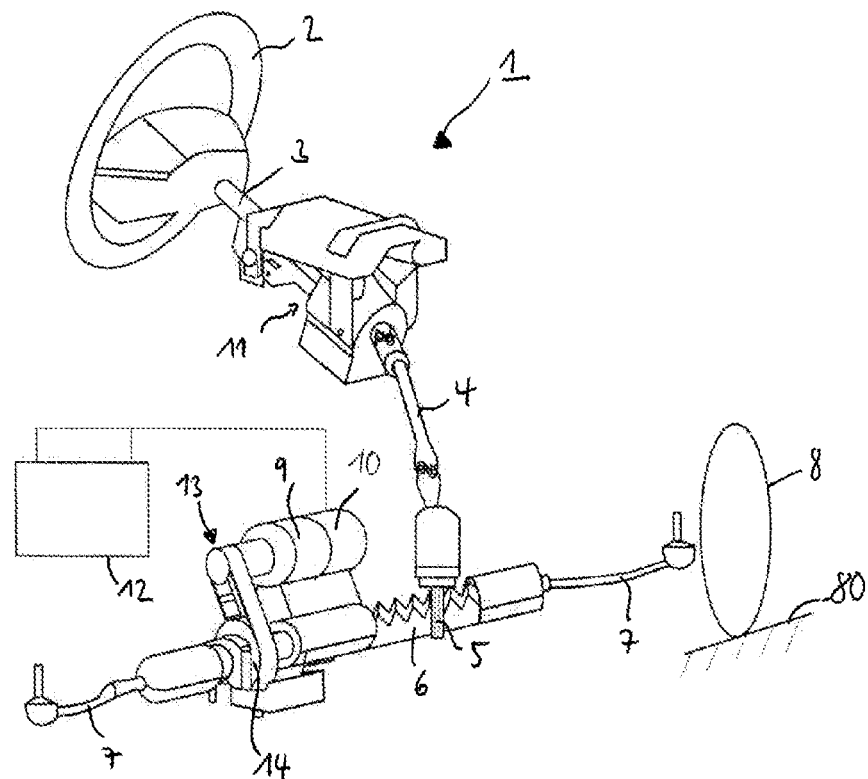
FIG. 1 is a schematic view of an example electromechanical power steering system.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting "a" element or "an" element in the appended claims does not restrict those claims to articles, apparatuses, systems, methods, or the like having only one of that element, even where other elements in the same claim or different claims are preceded by "at least one" or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

Accordingly, a motor vehicle steering system comprising an electric motor for assisting the steering movement, and a control unit which controls the electric motor, are provided, wherein the control unit has at least two redundant control paths for controlling the electric motor, and an asymmetry detection device, wherein the asymmetry detection device is configured to compare the electric current intensities of the two control paths, and to cause the faulty control path to be interrupted if there is asymmetry. This can prevent a fault from propagating and the control unit from becoming functionally incapable. The presence of two redundant control paths for controlling the electric motor comprises the fact that the electric motor can be controlled using two control paths which are respectively separate from one another. However, it is also possible to provide that the electric motor contains a plurality of coil sets or is composed of a plurality of separate motors whose rotational axes are mechanically coupled. In these cases, a control path is provided for controlling a coil set or is provided for controlling a motor, respectively.

Each control path preferably has at least one switching element which is connected to the asymmetry detection device in order to interrupt the control paths.

Each control path preferably has a current measuring device which measures the electric current intensity separately and individually for each control path.

It is advantageous if each control path comprises an inverter, wherein the current measuring device is arranged upstream of the inverter in the direction of the signals.

In one advantageous embodiment, each control path has a separate power source in order to increase the redundancy further.

Each control path preferably has a separate interface to a motor control unit of the electric motor.

In one preferred embodiment, the asymmetry detection device has an operational amplifier.

There can additionally be provision that the asymmetry detection device has, for each control path, a latching comparator which is configured to compare the signal with a pre-set reference voltage, and to generate an output signal on the basis of this voltage comparison.

In one advantageous embodiment, the motor vehicle steering system is an electromechanical motor vehicle power steering system, comprising an upper steering shaft, which is connected to a steering means, and a lower steering shaft, which is connected to the upper steering shaft via a torsion bar, a torque sensor unit, which senses a torque, introduced into the upper steering shaft by the driver, of a steering movement, the electric motor for assisting the steering movement, and the control unit as described above which is configured to control the electric motor as a function of the measured torque. The steering means is preferably a steering wheel or a joystick.

However, there can also be provision that the motor vehicle steering system is a steer-by-wire steering system, comprising a steering actuator which acts on the steered wheels, is controlled electronically as a function of a driver's steering request and acts on the steered wheels by means of a steering gear, and a feedback actuator which transmits reactions of the road to a steering wheel and has the electric motor and the control unit as described above.

Furthermore, a method is provided for controlling an electric motor of a motor vehicle steering system having a control unit comprising at least two redundant control paths and an asymmetry detection device, wherein each control path has at least one switching element and a current measuring device, and wherein the following method steps are provided:

measuring the respective electric current intensity in the two current measuring devices,
comparing the measured electric current intensities by means of the asymmetry detection device,
if the difference value of the two electrical intensities exceeds a predefined limiting value, interrupting the power supply of the faulty control path by means of the at least one switching element, and
controlling the electric motor by means of the fault free control path.

Each control path preferably comprises an inverter, wherein the current measuring device is arranged upstream of the inverter in the direction of the signals.

In order to increase the redundancy further, each control path can have a separate power source.

Each control path preferably has a separate interface to a motor control unit of the electric motor.

In one preferred embodiment, the asymmetry detection device has an operational amplifier.

There can also be provision that the asymmetry detection device has, for each control path, a latching comparator which is configured to compare the signal with a pre-set reference voltage and to generate an output signal on the basis of this voltage comparison.

In a preferred embodiment, if a faulty control path exists, the comparator of the fault free control path is deactivated for a brief time, as a result of which faulty fault detection in the fault free control path can be prevented.

The method can also be used, as described above, both in electromechanical power steering systems and in steer-by-wire steering systems.

FIG. 1 is a schematic illustration of an electromechanical motor vehicle power steering system 1 with a steering means 2 which is embodied as a steering wheel and is coupled in a co-rotational fashion to an upper steering shaft 3. The driver applies a corresponding torque as a steering command to the upper steering shaft 3 via the steering wheel 2. The torque is then transmitted to a steering pinion 5 via the upper steering shaft 3 and the lower steering shaft 4. The pinion 5 meshes in a known fashion with a toothed segment of a toothed rack 6. The toothed rack 6 is displaceably mounted in the direction of its longitudinal axis in a steering housing. At its free end, the toothed rack 6 is connected to tie rods 7 via ball and socket joints (not illustrated). The tie rods 7 themselves are connected in a known fashion to one steered wheel 8 each of the motor vehicle via stub axles. A rotation of the steering wheel 2 brings about, via the connection of the steering shaft 3 and of the pinion 5, longitudinal shifting of the toothed rack 6 and therefore pivoting of the steered wheels 8. The steered wheels 8 experience, via an underlying surface 80, a reaction which counteracts the steering movement. In order to pivot the wheels 8, there is therefore a need for a force which requires a corresponding torque at the steering wheel 2. An electric motor 9 of a servo unit 10 is provided in order to assist the driver during this steering movement. The upper steering shaft 3 and the lower steering shaft 4 are coupled to one another in a rotationally elastic fashion via a torsion bar (not shown). A torque sensor unit 11 senses the rotation of the upper steering shaft 3 with respect to the lower steering shaft 4 as a measure of the torque which is manually applied to the steering shaft 3 or the steering wheel 2. A control unit 12 calculates the steering assistance as a function of the torque measured by the torque sensor unit 11, and said steering assistance is made available to the driver by the servo unit 10. The control unit 12 is of redundant design. The servo unit can be coupled here as a power steering assistance device either to a steering shaft, to the steering pinion or to the toothed rack. The respective power steering assistance system inputs a power steering torque into the steering wheel, the steering pinion and/or into the toothed rack, which assists the driver during the steering work. The servo unit 10 which is shown in FIG. 1 acts via a belt drive 13 on a ball screw 14 whose screw spindle is formed on the toothed rack 6.

Figure 2:
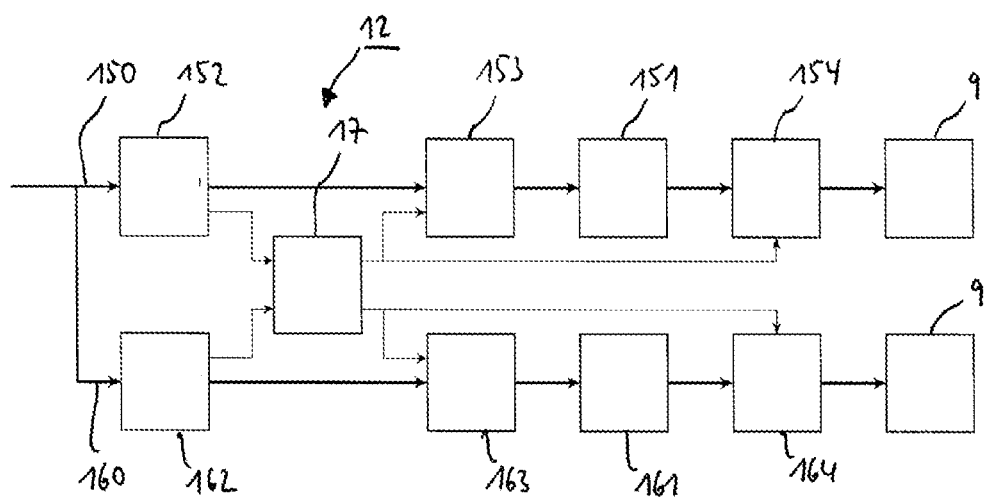
FIG. 2 is a block diagram of an example protection device for a motor controller.

The redundantly configured control unit 12 is illustrated schematically in FIG. 2. The control unit 12 has two control paths 150, 160, which each comprise an inverter 151, 161 which is configured to convert the voltage signals into phase currents for controlling the motor phases. The electric motor 9 can be controlled via two control paths 150, 160 which are each separate from one another. However, it can also be provided that the electric motor 9 contains a plurality of coil sets or is composed of a plurality of separate motors whose rotational axles are mechanically coupled. In these cases, one control path is provided for controlling a coil set and one for controlling a motor, respectively. The current flowing into the two control paths 150, 160 is measured separately for each of the two control paths in the direction of the signals upstream of the corresponding inverter 151, 161, preferably by means of a current sensor 152, 162. The values of the two current measurements are input into an asymmetry detection device 17 which is configured to detect asymmetry of the current between the two control paths 150, 160. The asymmetry detection device 17 preferably has an operational amplifier. The consumption of current in the two control paths 150, 160 is normally the same. If a short circuit of the battery to ground occurs in one of the control paths 150, 160, in a first moment the current is fed back through existing intermediate circuit capacitors so that the signal of the faulty control path 150, 160 is in the opposite direction to the signal of the fault free control path 150, 160. The unbalance which is present between the two current consumption levels in the two control paths 150, 160 is detected in the asymmetry detection device 17. If the differential value exceeds a predefined limiting value, the faulty control path 150, 160 is disconnected from the battery, and the fault free control path 150, 160 assumes the control of the electric motor 9. The asymmetry detection device 17 preferably has, for each control path 150, 160, a latching comparator (not illustrated here) which compares the signal with a pre-set reference voltage and generates an output signal on the basis of this voltage comparison. A difference amplifier is preferably connected upstream of the comparator. In the faulty control path, the output signal causes the control path to be switched off. Switching elements 153, 154, 163, 164, which can be triggered by the comparator to interrupt the control path 150, 160, are provided in each control path 150, 160, upstream and downstream of the inverter 151, 161 in the direction of the signals. The switching elements 153, 163 disconnect the battery so that the voltage supply does not dip. The switching elements 154, 164 disconnect the motor so that the fault does not cause a braking torque.

The switching elements 153, 154, 163, 164 are preferably FETs, in particular MOSFETs.

A short circuit in one of the control paths 150, 160 can cause a transient overvoltage in the other fault free control path 150, 160. The transients can cause the fault free control path 150, 160 to switch off, since it cannot be ruled out that the overvoltage is detected as a short circuit in the asymmetry detection device 17. In order to prevent such an undesired event, a circuit (not illustrated here) for mutual deactivation of the comparators is provided. If a short circuit occurs in one of the control paths 150, 160 and if said short circuit is detected, the comparator of the fault free control path 150, 160 is deactivated for a brief period of time. In this way, it is possible to prevent transient overvoltage in the fault free control path 150, 160 from being interpreted as a short circuit.

There is preferably provision that the two control paths 150, 160 have a separate power supply, i.e. the power supply is also of redundant design.

The two control paths 150, 160 preferably have an interface (not illustrated here) to the motor control unit (MCU)

which makes it possible to carry out motor tests, reset motor set-point values, switch the motor on and off and read back motor actual values.

What is claimed is:

1. A motor vehicle steering system comprising:
an electric motor; and
a control unit that controls the electric motor, wherein the control unit includes
at least two redundant control paths for controlling the electric motor, and
an asymmetry detection device including a latching comparator that is configured to compare a signal with a preset reference voltage and to generate an output signal based on a comparison of the signal and the preset reference voltage.

2. The motor vehicle steering system of claim 1 wherein each of the at least two redundant control paths includes a switching element that is connected to the asymmetry detection device for interrupting the respective redundant control path.

3. The motor vehicle steering system of claim 1 wherein each of the at least two redundant control paths includes a current measuring device configured to measure the respective electric current density.

4. The motor vehicle steering system of claim 3 wherein each of the at least two redundant control paths includes an inverter, with the current measuring device being disposed upstream of the inverter in a signal direction.

5. The motor vehicle steering system of claim 1 wherein each of the at least two redundant control paths includes a separate power source.

6. The motor vehicle steering system of claim 1 wherein each of the at least two redundant control paths includes a separate interface to a motor control unit of the electric motor.

7. The motor vehicle steering system of claim 1 wherein the asymmetry detection device includes an operational amplifier.

8. The motor vehicle steering system of claim 1 configured as an electromechanical motor vehicle power steering system that comprises:
an upper steering shaft connected to a steering means;
a lower steering shaft connected to the upper steering shaft via a torsion bar; and
a torque sensor unit configured to sense a torque of a steering movement, wherein the torque is received at the upper steering shaft from a driver,
wherein the electric motor is configured to assist the steering movement, wherein the control unit is configured to control the electric motor based on the torque that is sensed.

9. The motor vehicle steering system of claim 1 configured as a steer-by-wire steering system that comprises a steering actuator configured to act on steered wheels, wherein the steer-by-wire steering system is controlled electronically based on a driver steering request, wherein the steer-by-wire steering system is configured to act on the steered wheels by way of a steering gear, the steer-by-wire steering system comprising a feedback actuator configured to transmit reactions of a road to a steering wheel.

10. The motor vehicle steering system of claim 1 wherein the asymmetry detection device is configured to compare electric current intensities of the at least two redundant control paths and to cause a faulty control path to be interrupted when asymmetry exists.

11. A method for controlling an electric motor of a motor vehicle steering system that includes a control unit with at least two redundant control paths and an asymmetry detection device including a latching comparator that compares an input signal with a preset reference voltage and generates an output signal based on a comparison of the input signal and the preset reference voltage, wherein each of the at least two redundant control paths includes a switching element and a current measuring device, the method comprising:
measuring an electric current intensity in each current measuring device;
comparing the electric current intensities with the asymmetry detection device;
interrupting power supply to a faulty control path of the at least two redundant control paths with the respective switching element when a difference between the electric current intensities exceeds a predefined limiting value; and
controlling the electric motor by way of a fault-free control path of the at least two redundant control paths.

12. The method of claim 11 wherein each of the at least two redundant control paths comprises an inverter, with the current measuring device being disposed upstream of the inverter in a signal direction.

13. The method of claim 11 wherein each of the at least two redundant control paths includes a separate power source.

14. The method of claim 11 wherein each of the at least two redundant control paths includes a separate interface to a motor control unit of the electric motor.

15. The method of claim 11 wherein the asymmetry detection device includes an operational amplifier.

16. The method of claim 11 comprising deactivating the latching comparator of the fault-free control path when one of the at least two redundant control paths becomes faulty.

* * * * *